US009127352B2

(12) United States Patent
Itoh et al.

(10) Patent No.: US 9,127,352 B2
(45) Date of Patent: Sep. 8, 2015

(54) CYLINDRICAL SPUTTERING TARGET, AND METHOD FOR MANUFACTURING SAME

(75) Inventors: Kenichi Itoh, Ayase (JP); Kimiaki Tamano, Ayase (JP); Shigehisa Todoko, Tokyo (JP); Tetsuo Shibutami, Ayase (JP)

(73) Assignee: TOSOH CORPORATION, Yamaguchi (JP)

( * ) Notice: Subject to any disclaimer, the term of this patent is extended or adjusted under 35 U.S.C. 154(b) by 637 days.

(21) Appl. No.: 13/120,863

(22) PCT Filed: Sep. 18, 2009

(86) PCT No.: PCT/JP2009/066399
§ 371 (c)(1),
(2), (4) Date: Jun. 7, 2011

(87) PCT Pub. No.: WO2010/035718
PCT Pub. Date: Apr. 1, 2010

(65) Prior Publication Data
US 2011/0240467 A1 Oct. 6, 2011

(30) Foreign Application Priority Data

Sep. 25, 2008 (JP) ................................ P2008-245956

(51) Int. Cl.
C23C 14/34 (2006.01)
H01J 37/34 (2006.01)
(52) U.S. Cl.
CPC .......... *C23C 14/3407* (2013.01); *H01J 37/3423* (2013.01); *H01J 37/3435* (2013.01); *Y10T 156/10* (2015.01)
(58) Field of Classification Search
CPC .............. C23C 14/3407; H01J 37/3423; H01J 37/3435; Y10T 156/10
USPC ........................... 204/298.12, 298.21, 298.22
See application file for complete search history.

(56) References Cited

U.S. PATENT DOCUMENTS 3,025,596 A * 3/1962 Ward et al. .................... 228/131
2004/0140206 A1 7/2004 Voutsas et al.
(Continued)

FOREIGN PATENT DOCUMENTS

| JP | 08-060351 A | 3/1996 |
|----|-------------|--------|
| JP | 2000-204468 A | 7/2000 |
| JP | 2002-180243 A | 6/2002 |
| JP | 2005-281862 A | 10/2005 |
| JP | 2007-039803 A | 2/2007 |
| JP | 2007-070715 A | 3/2007 |
| JP | 2007-277667 A | 10/2007 |
| JP | 2008-038250 A | 2/2008 |
| JP | 2008-523251 A | 7/2008 |
| JP | 2008-184640 A | 8/2008 |
| TW | 200641164 A | 12/2006 |
| TW | 200714730 A | 4/2007 |

OTHER PUBLICATIONS

Extended European Search Report dated May 7, 2012 issued in application No. 09816133.4-1215.

*Primary Examiner* — Rodney McDonald
(74) *Attorney, Agent, or Firm* — Sughrue Mion, PLLC

(57) ABSTRACT

Provided is a cylindrical sputtering target which attains a high production yield in a film-forming process even when a film is formed by sputtering with a long cylindrical sputtering target constituted by a plurality of cylindrical target materials. A multi-divided cylindrical sputtering target formed by bonding a cylindrical base and a plurality of cylindrical target materials together with a bonding material has a divided portion where adjacent cylindrical target materials are arranged with a gap therebetween, while outer peripheral faces of the adjacent cylindrical target materials have a step of 0.5 mm or less therebetween in the divided portion. Such a target is obtained by fixing the cylindrical target materials with reference to the outer peripheral faces of the cylindrical target materials when arranging the cylindrical target materials with reference to the cylindrical base.

3 Claims, 5 Drawing Sheets

(56) References Cited

U.S. PATENT DOCUMENTS

| | | |
|---|---|---|
| 2006/0065524 A1 | 3/2006 | Newcomb et al. |
| 2006/0151321 A1 | 7/2006 | Itoh et al. |
| 2006/0266639 A1* | 11/2006 | Le et al. ............ 204/192.1 |
| 2007/0029192 A1 | 2/2007 | Schuhmacher et al. |
| 2007/0062809 A1* | 3/2007 | Nolette et al. ........ 204/298.12 |
| 2007/0074969 A1* | 4/2007 | Simpson et al. ........ 204/192.1 |
| 2009/0250337 A1 | 10/2009 | Simons et al. |

* cited by examiner

CYLINDRICAL SPUTTERING TARGET, AND METHOD FOR MANUFACTURING SAME

CROSS REFERENCE TO RELATED APPLICATIONS

This application is a National Stage of International Application No. PCT/JP2009/066399 filed Sep. 18, 2009, claiming priority based on Japanese Patent Application No. 2008-245956, filed Sep. 25, 2008, the contents of all of which are incorporated herein by reference in their entirety.

TECHNICAL FIELD

The present invention relates to a cylindrical sputtering target and a method for manufacturing the same.

BACKGROUND ART

Glass substrates used in flat panel displays and solar cells have recently been increasing their sizes, thereby requiring cylindrical targets having a length of 3 m or more in order to form thin films on the substrates having thus increased sizes. Such long cylindrical sputtering targets are used in magnetron rotary cathode sputtering apparatus. A typical cylindrical sputtering target is formed by fixing a cylindrical target material onto a long cylindrical base, while a seamless pipe made of a metal is used as the cylindrical base in general. Polishing the whole surface of a long cylindrical base is uneconomical because of its cost and problematic in terms of processing accuracy. Therefore, only both end parts of the cylindrical base are polished so as to attach to the sputtering apparatus, while the part where the cylindrical target material is fixed is left as it is as the seamless pipe and thus incurs swells and warpages instead of becoming a true circle.

There is a case where a long cylindrical sputtering target is constructed by stacking 10 or more small-sized cylindrical target materials, while misalignments in stacking may cause steps between the outer peripheral faces of the cylindrical target materials. Further, a multi-divided cylindrical sputtering target constituted by a plurality of cylindrical target materials requires a divided portion where adjacent cylindrical target materials are arranged with a gap therebetween in order to prevent the cylindrical target materials from colliding with each other and breaking as being thermally expanded by plasmas during sputtering. In particular, steps are likely to occur between the outer peripheral faces of the adjacent cylindrical target materials in such a divided portion.

Known as a method for preventing steps from occurring in a flat type target in which a plurality of target members are arranged on a single backing plate is one (e.g., Patent Literature 1) in which a target member having a higher sputtering surface forms a slope on the sputtering surface on the divided portion side leading to a lower sputtering surface. However, this method makes it necessary to polish a target material, which is problematic in that a greater loss occurs in the target material.

Also known as a method for aligning the centers of a cylindrical target material and a cylindrical base is one (see, for example, Patent Literatures 2 and 3) aligning the centers by using a spacer slightly thinner than the gap between the cylindrical base and the cylindrical target material with reference to the outer peripheral face of the cylindrical base and the inner peripheral face of the target material. When a long cylindrical base is used in this method, however, there are cases where the cylindrical target material cannot be inserted into the cylindrical base, or the position of the cylindrical target material is restricted by the form of the cylindrical base so that steps occur between the outer peripheral faces of adjacent cylindrical target materials.

CITATION LIST

Patent Literature

Patent Literature 1: Japanese Patent Application Laid-Open No. 2000-204468
Patent Literature 2: Japanese Patent Application Laid-Open No. 08-060351
Patent Literature 3: Japanese Patent Application Laid-Open No. 2005-281862

SUMMARY OF INVENTION

Technical Problem

It is an object of the present invention to provide a cylindrical sputtering target which attains a high production yield in a film-forming process even when a film is formed by sputtering with a long cylindrical sputtering target constituted by a plurality of cylindrical target materials.

Solution to Problem

The inventors conducted diligent studies in order to achieve the above-mentioned object and, as a result, have found that, in a cylindrical sputtering target constituted by a plurality of cylindrical target materials, suppressing steps between the outer peripheral faces of adjacent cylindrical target materials can inhibit abnormal electrical discharge and particles from occurring at the time of forming the film by sputtering, thereby completing the present invention.

Hence, the present invention is a cylindrical sputtering target formed by bonding a plurality of stacked cylindrical target materials to an outer peripheral face of a cylindrical base with a bonding material, the cylindrical sputtering target having a divided portion where adjacent cylindrical target materials are arranged with a gap therebetween, outer peripheral faces of the adjacent cylindrical target materials having a step of 0.5 mm or less therebetween in the divided portion.

Also, the present invention is a method for manufacturing a cylindrical sputtering target by bonding a plurality of stacked cylindrical target materials to an outer peripheral face of a cylindrical base with a bonding material, wherein, when arranging the plurality of cylindrical target materials with reference to the cylindrical base, one of adjacent cylindrical target materials is fixed with reference to an outer peripheral face of the other such that outer peripheral faces of the adjacent cylindrical target materials have a step of 0.5 mm or less therebetween.

Advantageous Effects of Invention

Even when a film is formed by sputtering with a long cylindrical sputtering target constituted by a plurality of cylindrical target materials, the present invention can restrain abnormal electrical discharge and particles from occurring, thereby enhancing the production yield in the film-forming process.

DESCRIPTION OF EMBODIMENTS

Figure 1:
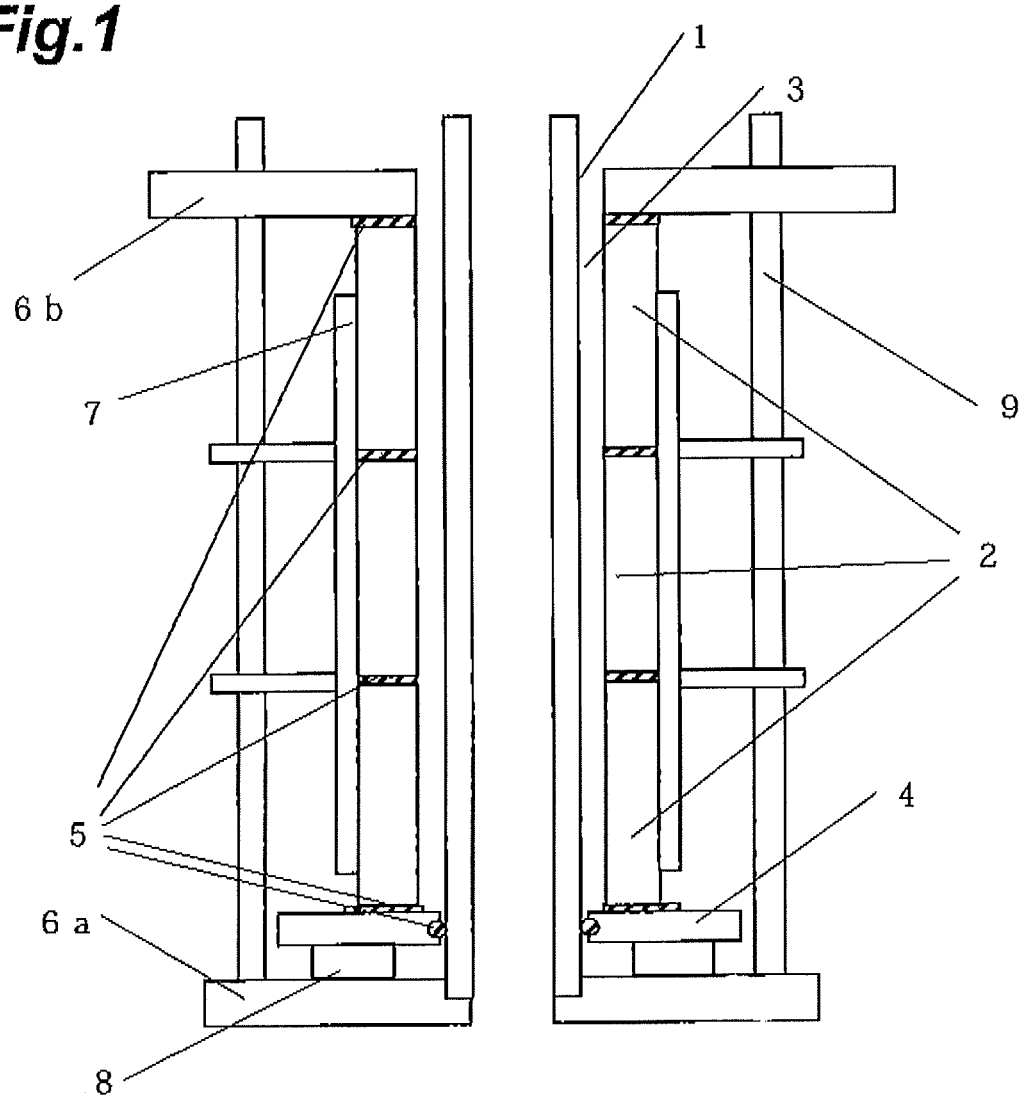
FIG. 1 is a longitudinal sectional view illustrating an example of an assembling state of a cylindrical sputtering target in the present invention.

In the following, the present invention will be explained in detail with reference to FIGS. 1 to 3.

As cylindrical target materials 2 used in the cylindrical sputtering target of the present invention, various materials employed in sputtering in general are usable, examples of which include metals such as In, Sn, Zn, Al, Nb, and Ti, alloys containing these metals, and oxides, nitrides, and the like of at least one kind of these metals and the like. Examples of the oxides include ITO (Indium Tin Oxide), AZO (Aluminum Zinc Oxide), IZO (Indium Zinc Oxide), $SnO_2$, $In_2O_3$, $Al_2O_3$, $TiO_2$, and ZnO. The effects of the present invention can be obtained in particular with such brittle ceramics materials.

Various materials are usable as a cylindrical base 1 employed in the cylindrical sputtering target of the present invention. It will be sufficient if this material has such thermal conductivity as to effect sufficient cooling so that a bonding material for bonding the cylindrical target materials 2 to the cylindrical base 1 is kept from deteriorating and melting upon sputtering with the target, such electric conductivity as to be dischargeable from the target materials 2 during sputtering, such strength as to be able to support the target, and so forth. Examples of such a material include Cu, Ti, Al, Mo, alloys containing these metals, and SUS.

The length of the cylindrical material 1 is not restricted in particular. Even with a cylindrical base having a length of 1000 mm or more, the cylindrical sputtering target in this embodiment can form a film with a favorable yield.

It will be sufficient if the bonding material used in the cylindrical sputtering target of this embodiment has such thermal conductivity as to effect sufficient cooling so that the bonding material is kept from deteriorating and melting upon sputtering with the target, such electric conductivity as to be dischargeable from the target material 2 during sputtering, such strength as to be able to support the target, and so forth. Examples of the material include solder materials and electrically conductive resins.

Usable as the solder materials are those employed as solder materials in general. Preferred is low-melting solder, examples of which include In, In alloys, Sn, and Sn alloys. More preferred is In or In alloy solder. The In or In alloy solder has abundantly been used in practice in flat type targets, while being so rich in ductility as to be effective in mitigating distortions caused by thermal expansion between the target materials 2 heated during sputtering and the cooled base 1 and the like.

Examples of the electrically conductive resins include those in which thermosetting resins such as epoxy, acrylic, polyester, urethane, and phenol are mixed with electrically conductive materials such as Ag, C, and Cu acting as fillers.

The cylindrical sputtering target of this embodiment is formed by bonding a plurality of cylindrical target materials 2 to the cylindrical base 1 and has a divided portion in which adjacent cylindrical target materials 2 are arranged with a gap therebetween, while the step between the outer peripheral faces of the adjacent target materials 2 in the divided portion is 0.5 mm or less. The step is preferably 0.3 mm or less, more preferably 0.2 mm or less. When sputtering is carried out by using a cylindrical sputtering target having a large step, electric fields are likely to concentrate at edges of a protruded cylindrical target material, thereby generating abnormal electrical discharge, which makes it easier for the edges of the target material to break, thus yielding particles. In particular, when a large step exists in the cylindrical sputtering target, an inverted step exists on the opposite side of the former step because of the cylindrical structure. Hence, when such a target is rotated, two large steps appear per rotation. Since sputtering is carried out while the cylindrical target rotates, turbulence in electric fields due to the large step is deemed to occur twice per rotation, thereby causing abnormal electrical discharge. Since the cylindrical target rotates once every about 3 to 15 sec during sputtering, turbulence in electric fields seems to occur twice every about 3 to 15 sec, thereby causing abnormal electrical discharge. Since higher power is fed into the cylindrical sputtering target than in the flat type sputtering target, the influence of the step in target materials in the divided portion is very large.

Figure 3:
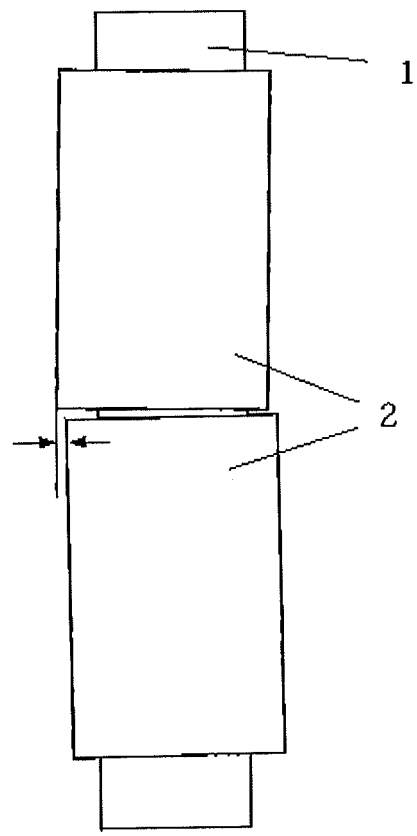
FIG. 3 is a schematic view for explaining a step on the outer peripheral face of the cylindrical sputtering target in the present invention.

In this embodiment, the step between the outer peripheral faces of the adjacent cylindrical target materials 2 in the divided portion is the part of "deviation" indicated by arrows in FIG. 3 and represents its maximum value in the cylindrical sputtering target. That is, it means that the deviation is 0.5 mm or less in all the divided portions in this embodiment.

Since the cylindrical sputtering target of this embodiment has a divided portion in which adjacent cylindrical target materials 2 are arranged with a gap therebetween, it can prevent the target materials 2 from colliding with each other and breaking as being thermally expanded by plasmas during sputtering. However, a distribution of gaps in the divided portion, if any, may cause the cylindrical target materials 2 to shift their positions from each other, thereby generating a step between the outer peripheral faces of the target materials 2. Therefore, the distribution of gaps in the divided portion is preferably ±0.1 mm or less, more preferably ±0.05 mm or less. The distribution of gaps in the divided portion in this embodiment is the difference between the average value and the maximum and minimum values when gaps are measured at eight or more locations at circumferentially equal intervals in the divided portion, or the largest value of such differences when there are a plurality of divided portions.

The gap in the divided portion is not 0, but can be designed to become an optimal value according to the length and thermal expansion coefficient of the cylindrical target materials 2. When the gap is too narrow, however, there is a possibility that the cylindrical target materials 2 may be thermally expanded by plasmas during sputtering so as to collide with each other, thereby breaking. Therefore, the gap between the closest parts of the adjacent target materials 2 is preferably 0.1 mm or more. When the gap in the divided portion is too large, on the other hand, there is a possibility of the bonding material being sputtered. Hence, it will be preferred if the gap in the divided portion is determined in view of the mean free path of sputtering gases in use and the efficiency in use of the target so as to become such a value that the bonding material of the divided portion is not sputtered. When the average values of gaps in divided portions are determined as mentioned above, the average value in each divided portion is preferably 0.5 mm or less in practice, more preferably 0.4 mm or less.

Preferably, in the cylindrical target materials 2 used in this embodiment, the edge parts of the outer peripheral faces of the adjacent cylindrical target materials 2 are chamfered. This can prevent electric fields from concentrating at the edges of the cylindrical target materials 2 during sputtering, thereby inhibiting abnormal electrical discharge from occurring. In view of the influence on the film thickness distribution, the extent (width or depth) of chamfering is preferably 2 mm or less, more preferably 1 mm or less. The form of chamfering is not restricted in particular as long as it can mitigate the concentration of electric fields at the time of forming a film by sputtering and may be any of beveled, rounded, and stepped surfaces.

An example of methods for manufacturing the cylindrical sputtering target in accordance with this embodiment is one filling the interstices between the cylindrical base 1 and a plurality of cylindrical target materials 2 with a bonding material and bonding them together. First, for filling with the bonding material, the cylindrical target materials 2 are arranged with reference to the cylindrical base 1, e.g., a plurality of cylindrical target materials 2 are stacked on the outside of the cylindrical base 1 beforehand. Thereafter, the lower parts of the interstices between the cylindrical base 1 and the cylindrical target materials 2 are sealed, so as to form a space to be filled with the bonding material. Then, alignment with the cylindrical base 1 is performed with reference to the outer peripheral faces of the cylindrical target materials 2. Preferably, such assembling of a cylindrical sputtering target is carried out with a jig. The material for the jig used here is not restricted in particular as long as it can resist heating at the time of filling with solder. Examples of the material include metals such as aluminum and duralumin.

Figure 2:
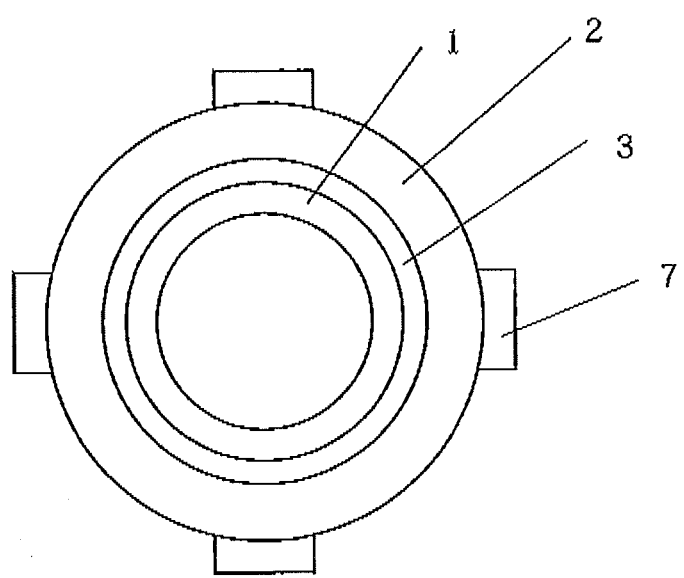
FIG. 2 is a diametrical sectional view illustrating the example of the assembling state of the cylindrical sputtering target in the present invention.

More specifically, as illustrated in FIG. 1, the cylindrical base 1 is inserted into a depression provided in a base support 6a, so as to be placed there, and fixed with a sealing jig 4 through a silicone O-ring. Both end parts of the cylindrical base 1, which act as vacuum seal parts using O-rings and the like for attaching to a sputtering apparatus and have accurately polished outer and/or inner peripheral faces, are preferably employed as reference surfaces for alignment. Placing a block 8 having a given size under the sealing jig 4 makes it possible to arrange the cylindrical target materials 2 with a given distance from an end face of the cylindrical base 1.

Then, the cylindrical target materials 2 are stacked on the sealing jig 4 at the outer peripheral face of the cylindrical base 1, so as to form a space 3 to be filled with the bonding material. Preferably, the cylindrical target materials 2 are concentric with the cylindrical base 1. For keeping hermeticity in the space 3 to be filled with the bonding material, the interstices between the plurality of cylindrical target materials 2, between the cylindrical target materials 2 and sealing jig 4, between the sealing jig 4 and cylindrical base 1, and between the cylindrical target materials 2 and a base support 6b are sealed with a sealant 5. In the case where the bonding material is low-melting solder or an electrically conductive resin, heating is performed, which makes it necessary to use a heat-resistant packing or O-ring as the sealant 5. In this case, materials such as Teflon (registered trademark) and silicone are usable. In particular, inserting the sealant 5 between the plurality of cylindrical target materials 2 can form predetermined gaps with a very small distribution in divided portions. Used as the sealant 5 inserted here is one having a predetermined thickness matching a desirable design value of gaps.

Thereafter, the base support 6b is mounted on the uppermost target material 2 with the sealant 5 interposed therebetween, and the upper and lower base supports 6a, 6b are connected to each other with a connecting shaft 9. Then, the cylindrical target materials 2 are fixed with target supports 7 having springs (not depicted) and screws (not depicted) with reference to their outer peripheral faces, e.g., such that their outer peripheral faces are aligned so as to minimize deviations at the divided portions, and the target supports 7 are joined to the connecting shaft 9 so as to be secured. The target supports 7 are adjustable to given positions with respect to the base supports 6a, 6b and may have a single rod structure pressing the outer peripheral faces of the target materials 2 to be bonded as illustrated or such a structure as to press only their peripheral parts including the divided portions of the target materials 2. For aligning the cylindrical target materials 2 with the base supports 6a, 6b, at least two target supports 7 are necessary. Preferably, three, more preferably four or more even number of base supports 7 are arranged at equal intervals at positions opposing each other as in FIG. 2. This can reliably suppress steps on the outer peripheries of cylindrical target materials.

After the assembling is completed by the foregoing procedure, it is verified that no steps exceeding 0.5 mm are formed at locations where no target support 7 presses the target materials 2.

When a solder material is used as the bonding material, for example, the whole cylindrical sputtering target assembled as in FIG. 1 is heated to a temperature of the melting point of the solder or higher, and the solder in a molten state is caused to flow into the space 3 from the upper part of the base support 6b so as to fill it. After the filling is completed, the solder is solidified by cooling, so as to bond the cylindrical base 1 and the cylindrical target materials 2 together. Since the bonding strength may be lowered by oxidization of the solder when the temperature is too high here, the heating temperature preferably falls within the range from the melting point of the solder to +100° C. thereabove, more preferably to +50° C. thereabove. The melting point of In solder is 156° C. When the bonding material is an electrically conductive resin, the space 3 of the cylindrical sputtering target assembled as in FIG. 1 is filled with the electrically conductive resin, and hardening such as heating is performed in conformity to the hardening condition for the resin, so as to bond the cylindrical target materials 2 to the cylindrical base 1.

Preferably, the bonding surfaces between the cylindrical base 1 and cylindrical target materials 2 are wetted beforehand in order to improve the wettability with the bonding material and make them easier to be filled with the bonding material. Any process is employable therefor as long as it can improve the wettability of the bonding material, examples of which include UV irradiation, plating or vapor deposition with Ni, and undercoating by a ultrasonic soldering iron.

After the cylindrical base 1 and the cylindrical target materials 2 are bonded together as in the foregoing, jigs, a surplus of the bonding material, and the like are removed, whereby a desirable cylindrical sputtering target is obtained. Here, the parts where the bonding material should not attach, the jigs to be removed, and the like may be masked beforehand, so that the removing operation can be performed easily. The sealant 5 between the adjacent cylindrical target materials 2 can easily be removed by utilizing the difference in thermal expansion between the cylindrical base 1 and cylindrical target materials 2 by heating after bonding them.

Example 1

The present invention will now be explained in detail with reference to examples, which do not restrict the present invention. The distribution and average value of gaps in each divided portion were determined by measuring gaps at eight locations as mentioned above.

Example 1

Twelve ITO cylindrical target materials (each having an outer diameter of 150 mm, an inner diameter of 133 mm, and a length of 260 mm) were prepared and masked with a heat-resistant tape except for their bonding surfaces, and the bonding surfaces were undercoated with In solder by a ultrasonic soldering iron. On the other hand, one cylindrical base made of SUS (having an outer diameter of 130 mm, an inner diameter of 120 mm, and a length of 3200 mm) was prepared and masked with a heat-resistant tape except for the bonding surface in order to prevent the bonding material from attaching to the surfaces other than the bonding surface, and the bonding surface was undercoated with the In solder by the ultrasonic soldering iron.

Then, thus processed cylindrical base 1 and 12 cylindrical target materials 2, the sealing jig 4 made of duralumin, the base supports 6a, 6b, the target support 7, and the block 8 were assembled as in FIG. 1. First, the cylindrical base 1 was arranged on the base support 6a and fixed with the sealing jig 4 through a silicone O-ring. The 12 cylindrical target materials 2 interposing the sealant 5 therebetween were sequentially fitted to the cylindrical base 1 so as to be stacked, and thereafter the base support 6b was mounted on the last cylindrical target material 2 with the sealant 5 interposed therebetween. Then, the upper and lower base supports 6a, 6b were connected to each other with the connecting shaft 9, so as to fix the cylindrical target materials 2. Subsequently, as in FIG. 2, the cylindrical target materials 2 were aligned and fixed by using the four target supports 7. Used here as the sealant 5 were ring-shaped Teflon (registered trademark) sheets between the adjacent cylindrical target materials 2 and between the cylindrical target materials 2 and sealing jig 4, and an O-ring made of silicon between the cylindrical base 1 and sealing jig 4.

Next, thus assembled cylindrical sputtering target as a whole was heated to 180° C., and molten In solder (having a melting point of 156° C.) was caused to flow into the space 3 from the upper side. After the In solder had completely flowed therein, the cylindrical sputtering target was cooled to 120° C. and, after the In solder was seen to have solidified totally, heated to 130° C. again, so as to cut and remove the Teflon (registered trademark) sheets between the adjacent cylindrical target materials 2, thereby forming divided portions having gaps. Thereafter, the cylindrical sputtering target was cooled to room temperature, so as to remove the jigs and masking, thereby making the ITO cylindrical sputtering target.

Thus obtained cylindrical sputtering target had a step of 0.2 mm in the outer peripheral face in divided portions, while the distribution of gaps in the divided portions was ±0.05 mm. The average value of gaps in each divided portion was 0.29 to 0.36 mm.

Comparative Example 1

Figure 4:
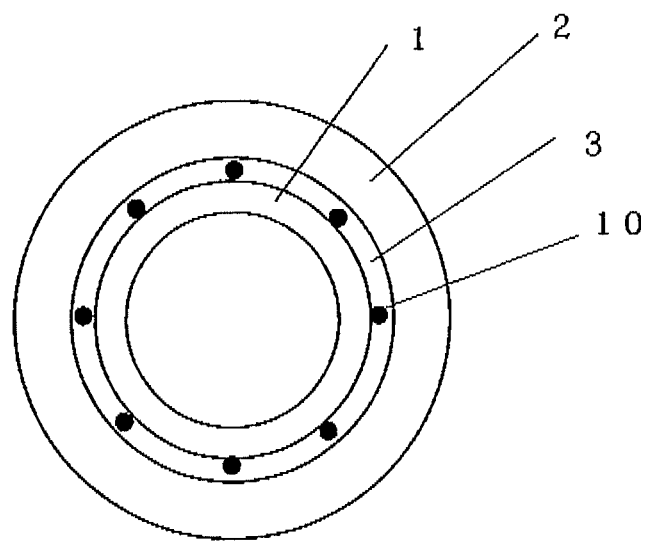
FIG. 4 is a diametrical sectional view illustrating an example of the assembling state of the cylindrical sputtering target in a comparative example.

The cylindrical base 1 and cylindrical target materials 2 were prepared as in Example 1, and eight copper wires (each having a diameter of 0.7 mm) were arranged as spacers 10 at equal intervals on the outer peripheral face of the cylindrical base 1 as illustrated in FIG. 4. Subsequently, while the cylindrical target materials 2 were fitted to the cylindrical base 1 as in the assembly view of FIG. 5 except that 12 cylindrical target materials 2 were used, the cylindrical target materials 2 failed to work on the way and thus could not be assembled into the cylindrical sputtering target.

Comparative Example 2

Figure 5:
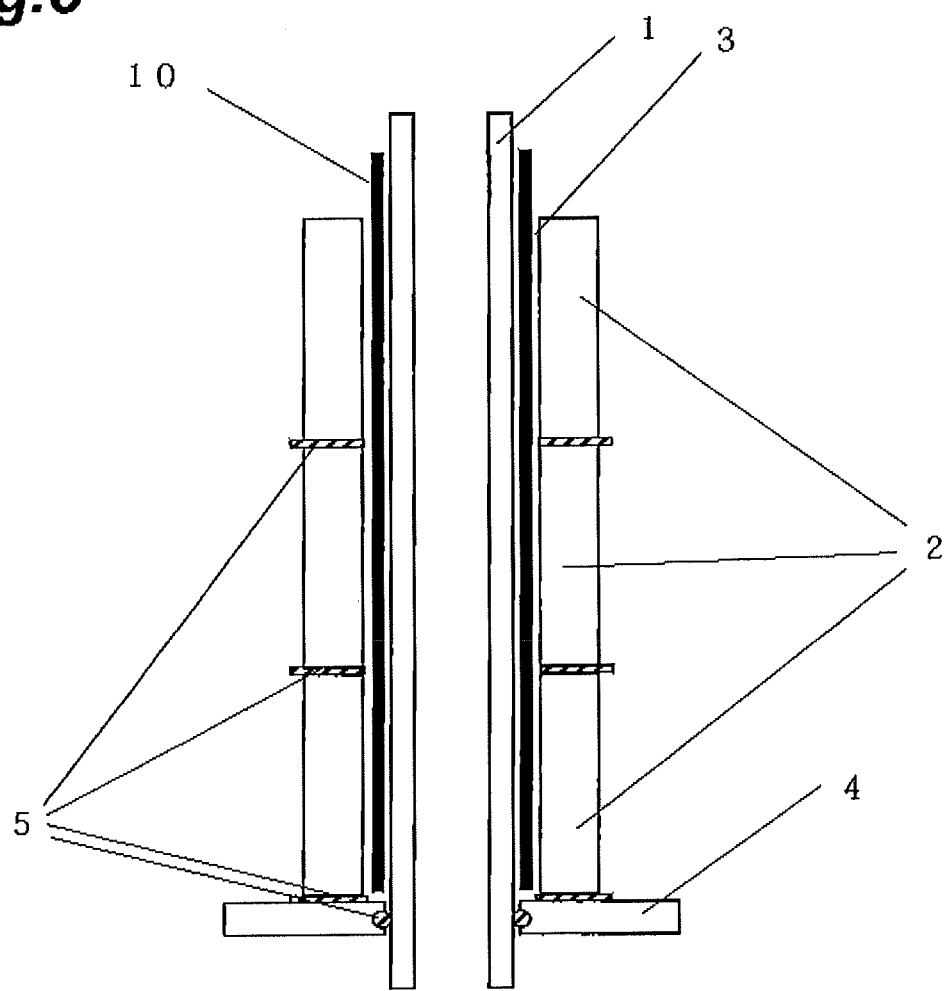
FIG. 5 is a longitudinal sectional view illustrating an example of the assembling state of the cylindrical sputtering target in a comparative example.

A cylindrical sputtering target was assembled as in FIG. 5 except for using 12 cylindrical target materials by the same method as with Comparative Example 1 except that the diameter of the copper wires acting as the spacers 10 in Comparative Example 1 was changed to 0.6 mm. Thereafter, the cylindrical base 1 and the cylindrical target materials 2 were bonded together with the In solder as in Example 1, so as to make a cylindrical target material. Thus obtained cylindrical sputtering target had a step of 0.8 mm in the outer peripheral face in divided portions, while the distribution of gaps in the divided portions was ±0.13 mm. The average value of gaps in each divided portion was 0.30 to 0.39 mm.

Example 2

Two ITO cylindrical target materials (each having an outer diameter of 93.0 mm, an inner diameter of 78.5 mm, and a length of 175 mm) were prepared and masked with a heat-resistant tape except for their bonding surfaces, and the bonding surfaces were undercoated with the In solder by the ultrasonic soldering iron. On the other hand, one cylindrical base made of SUS (having an outer diameter of 75.5 mm, an inner diameter of 70 mm, and a length of 490 mm) was prepared and masked with a heat-resistant tape except for the bonding surface in order to prevent the bonding material from attaching to the surfaces other than the bonding surface, and the bonding surface was undercoated with the In solder by the ultrasonic soldering iron. Thereafter, a target I having the divided portion listed in Table 1 was made by the same method as with Example 1 except for using the two cylindrical target materials. Targets II to IV having their corresponding divided portions listed in Table 1 were also made by the same method as with Example 1 except for using the two cylindrical target materials.

Comparative Example 3

Targets V to VII having their corresponding divided portions listed in Table 1 were also made by the same method as with Comparative Example 2 except for using two ITO cylindrical target materials (each having an outer diameter of 93.0 mm, an inner diameter of 78.5 mm, and a length of 175 mm) and one cylindrical base made of SUS (having an outer diameter of 75.5 mm, an inner diameter of 70 mm, and a length of 490 mm) without the copper wires.

Film Formation Evaluation

Thus made cylindrical sputtering targets were subjected to sputtering at 20 kWh under the following sputtering condition, and the number of occurrences of abnormal electrical discharge (arc) was measured by a micro arc monitor (manufactured by Landmark Technology Corporation) separately for small arcs (at least 2 μsec but less than 20 μsec) and large arcs (20 μsec or more) with reference to the discharge voltage fall time under the following measurement condition. Table 1 lists thus obtained results of electrical discharge.

Sputtering Condition
DC power: 15 W/cm$^2$ (with respect to the magnet area)
Target rotating speed: 6 rpm
Sputter gas: Ar+O$_2$
Gas pressure: 0.5 Pa
Arc Measurement Condition
Detection voltage: 300 V Small arc: at least 2 μsec but less than 20 μsec
Large arc: 20 μsec or more

TABLE 1

| | Target divided portion | | | Discharge results | |
|---|---|---|---|---|---|
| | Outer peripheral step | Average gap | Gap distribution | Cham-fer | Small arc | Large arc |
| I | 0.0 mm | 0.33 mm | ±0.03 mm | C1 | 176 times | 0 times |
| II | 0.2 mm | 0.32 mm | ±0.04 mm | none | 343 times | 0 times |
| III | 0.5 mm | 0.35 mm | ±0.05 mm | C1 | 437 times | 0 times |
| IV | 0.5 mm | 0.34 mm | ±0.04 mm | none | 688 times | 0 times |
| V | 0.8 mm | 0.37 mm | ±0.11 mm | none | 895 times | 16 times |
| VI | 0.6 mm | 0.32 mm | ±0.03 mm | none | 754 times | 14 times |
| VII | 0.7 mm | 0.33 mm | ±0.04 mm | none | 783 times | 13 times |

A comparison of the targets I to IV and V to VII with each other proves that large arcs can be inhibited from occurring when the step in the outer periphery of the divided portion is 0.5 mm or less, while a comparison of the targets III and IV with each other shows that small arcs can be restrained from occurring when edges of outer peripheral faces of targets are chamfered. An observation of the divided portions after the electrical discharge with a microscope showed that a protruded edge of the cylindrical target materials had broken in the targets V to VII.

When abnormal electrical discharge (arc) occurs, the film forming rate decreases, thereby lowering the productivity. In particular, large arcs having a long voltage fall time exhibit such a large energy as to cause damages to the target materials and thin films, so as to generate particles and deteriorate the quality of thin films, thereby lowering the production yield in a film-forming process. The present invention can deter such large arcs from occurring.

INDUSTRIAL APPLICABILITY

The present invention, which is used for a cylindrical sputtering target and a method for manufacturing the same, can provide a cylindrical sputtering target which attains a high production yield in a film-forming process even when a film is formed by sputtering with a long cylindrical sputtering target constituted by a plurality of cylindrical target materials.

REFERENCE SIGNS LIST 1 cylindrical base
2 cylindrical target material
3 space
4 sealing jig
5 sealant
6a, 6b base support
7 target support
8 block
9 connecting shaft
10 spacer

The invention claimed is:

1. A method for manufacturing a cylindrical sputtering target by bonding a plurality of stacked cylindrical target materials to an outer peripheral face of a cylindrical base with a bonding material, wherein, when arranging the plurality of cylindrical target materials with reference to the cylindrical base, an outer peripheral face of one of adjacent cylindrical target materials is fixed with a jig with reference to an outer peripheral face of the other such that outer peripheral faces of the adjacent cylindrical target materials have a step of 0.5 mm or less therebetween and
   wherein, when fixing the plurality of cylindrical target materials, a target support secured with respect to the cylindrical base presses the outer peripheral faces of the plurality of cylindrical target materials over a divided portion such that the outer peripheral faces thereof align.

2. A method for manufacturing a cylindrical sputtering target according to claim 1, wherein, while using at least one of outer and inner peripheral surfaces of at least one end part of the cylindrical base as a reference surface, the plurality of cylindrical target materials are fixed with reference to the reference surface.

3. A method for manufacturing a cylindrical sputtering target according to claim 1, wherein, when fixing the plurality of cylindrical target materials, an even number of target supports are arranged at respective positions opposing each other on the cylindrical target materials.

* * * * *